United States Patent [19]

Sekiguchi

[11] 3,891,940

[45] June 24, 1975

[54] TWO-TONE GENERATOR USING TRANSISTORS FOR SWITCHING LC RESONANT CIRCUITS

[75] Inventor: Kouichi Sekiguchi, Asaka, Japan

[73] Assignee: Iwasaki Tsushinki Kabushiki Kaisha, Japan

[22] Filed: Feb. 6, 1974

[21] Appl. No.: 439,985

[30] Foreign Application Priority Data

Feb. 10, 1973 Japan .............................. 48-16119
Sept. 21, 1973 Japan .............................. 48-105951

[52] U.S. Cl. .................. 331/48; 179/90 K; 331/56; 331/117 R; 331/179; 331/181

[51] Int. Cl. ......................... H03b 5/12; H04m 1/50

[58] Field of Search ........... 331/48, 56, 117 R, 179, 331/181; 179/90 K

[56] References Cited

UNITED STATES PATENTS 3,427,569 2/1969 Abramson .......................... 331/117
3,617,646 11/1971 Knollman .......................... 179/90 K

*Primary Examiner*—Siegfried H. Grimm
*Attorney, Agent, or Firm*—Robert E. Burns; Emmanuel J. Lobato; Bruce L. Adams

[57] ABSTRACT

A two-tone generator having switching transistors in two LC resonance circuits each composed of a coil and a capacitor for producing a dial tone in the form of two-tone signal by switching the value of the inductances of the coils in response to the control of each of a pair of push-button switches, in which only one make contact is actuated in response to the depression of each push button, so that the ON-OFF output of the contact is employed to control a desired one of a pair switching transistors in each of the two resonance circuits for determining the oscillation frequencies of the two-tone generator associated with the two LC resonance circuits. The switching transistors are coupled with the two LC resonance circuits to switch the value of the inductance of each coil in response to the turn-ON of the collector-emitter path thereof. Each of the switching transistors is turned-ON by flowing a base current greater than the peak value of the AC signal in the resonance circuit without flowing any DC current in the collector-emitter path thereof.

3 Claims, 8 Drawing Figures

PATENTED JUN 24 1975 3,891,940

SHEET 5

TWO-TONE GENERATOR USING TRANSISTORS FOR SWITCHING LC RESONANT CIRCUITS

This invention relates to a two-tone generator which includes switching transistors in two LC resonance circuits each composed of a coil and a capacitor for producing a dial tone in the form of a two-tone signal by switching the value of the inductances of the coils in response to the control of a plurality of push-button switches.

In a conventional push-button dial device including a two-tone generator, such as employed in usual key telephone sets in Japan, an oscillator has many mechanical contacts which are opened and closed by depression of corresponding push-bottons and which are turned-ON and -OFF in a ganged manner, thereby to select oscillation frequencies and to control the starting of oscillation thereof. Namely, a contact employed for starting the oscillator supplies a current therethrough to the oscillator upon depression of a push-button. Moreover, other contacts are employed to select predetermined oscillation frequencies. In this manner, oscillation is achieved at desired frequencies by the depression of a push-button corresponding to a desired one of the dial numbers 1, 2, 3, . . . 9, 0, etc.

Such a conventional push-button dial device requires the control of a plurality of (usually three) contacts, and hence involves the use of a complicated gang mechanism, which results not only in an increased force for depressing the push-buttons but also in troubles.

An object of this invention is to provide a two-tone generator having switching transistors capable of overcoming the above-mentioned defects resulting from the use of the ganged contacts but using a minimum number of mechanical contacts.

In accordance with the principle of this invention, only one make contact is actuated in response to the depression of each push-button, and the ON-OFF output of the contact is employed to control desired switching transistors for determining the oscillation frequencies of a two-tone oscillator.

The principle, construction and operations of this invention will be clearly understood from the following detailed description taken in conjunction with the accompanying drawings, in which.

Figure 1A:
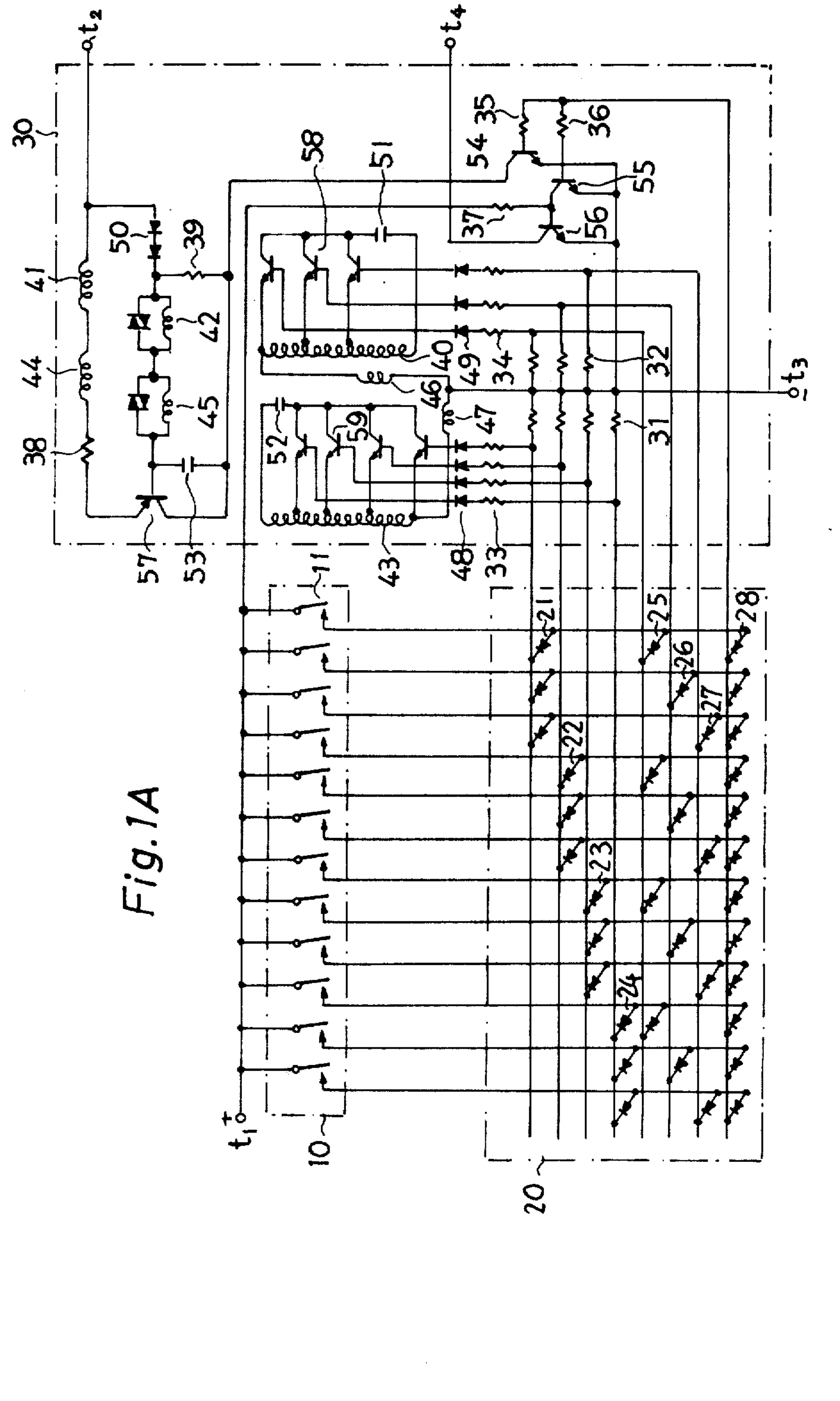
FIGS. 1A and 1B are circuit diagrams each illustrating an example of this invention.
Figure 2:
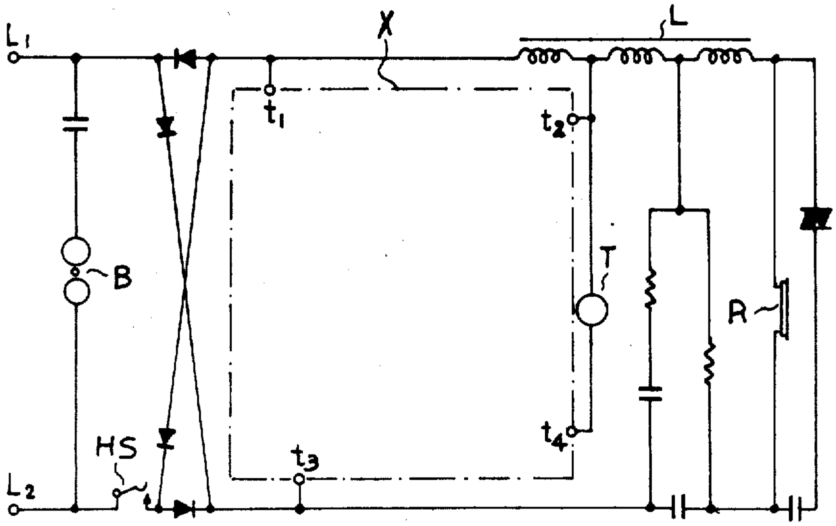
FIG. 2 is a circuit diagram illustrating a telephone set circuit employing the example shown in FIG. 1A.

With reference to FIGS. 1A and 2, a reference character X in FIG. 2 designates an oscillator circuit, which has connection terminals $t_1$, $t_2$, $t_3$ and $t_4$ corresponding to those $t_1$, $t_2$, $t_3$ and $t_4$ in FIG. 1A. In FIG. 1A, a reference numeral 10 indicates push-button switches having a plurality of contacts 11. A reference numeral 20 represents a diode matrix, which has a plurality of groups of diodes 21 to 28. A reference numeral 30 identifies an oscillator circuit, which is composed of resistor groups 31, 32, 33 and 34, resistors 35, 36, 37, 38 and 39, coils 40, 41 and 42 making up a three-winding transformer, coils 43, 44 and 45 formed into another three-winding transformer, choke coils or fixed resistors 46 and 47, diode groups 48, 49 and 50, capacitors 51, 52 and 53, transistors 54, 55, 56 and 57, and transistor groups 58 and 59.

The example of FIG. 1A is different from the conventional circuit in the replacement of the mechanical contacts by the switching transistors and in the provision of the diode matrix 20 for controlling the switching transistors, the choke coils 46 and 47 for preventing the lowering of the Q of the LC resonance circuits, and resistors and diodes for introducing a current to the bases of the switching transistors.

Figure 1B:
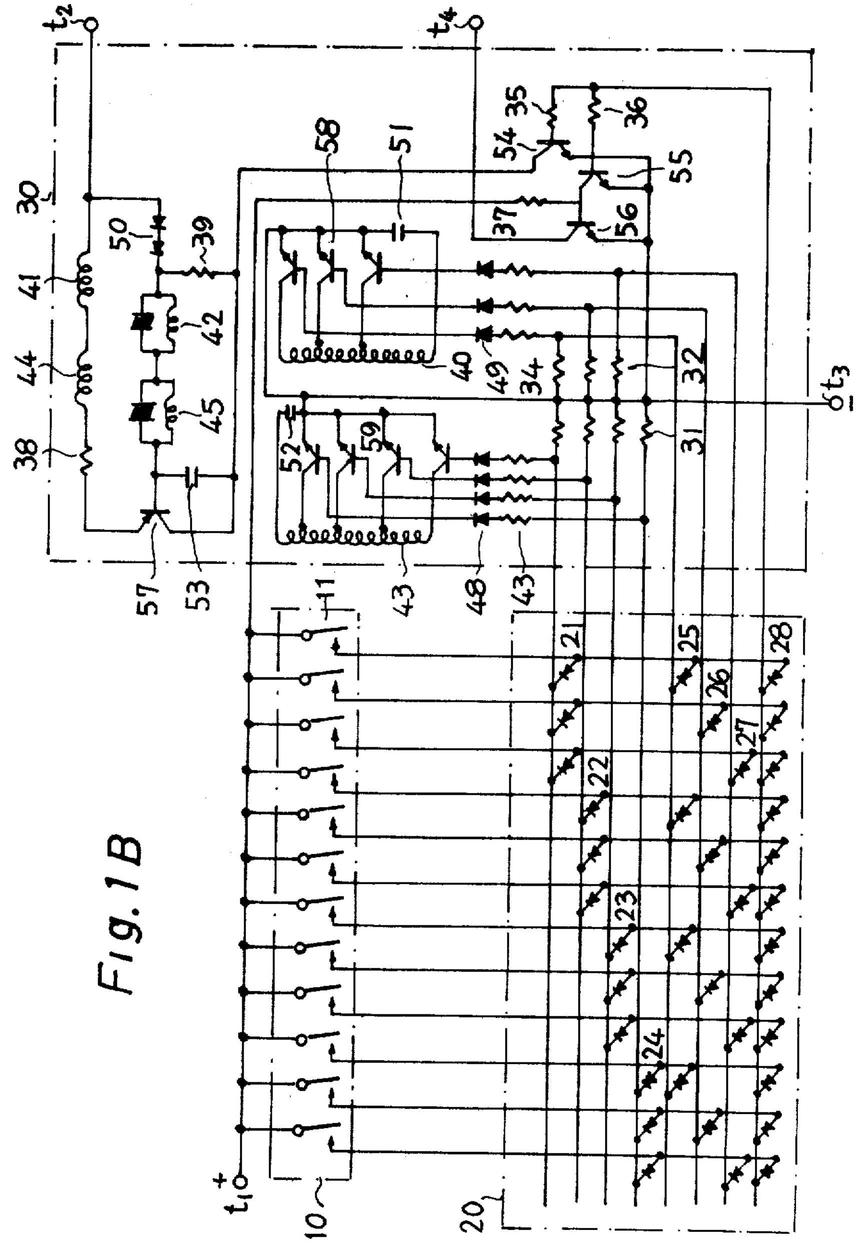

The example of FIG. 1A may be modified as shown in FIG. 1B, in which the choke coils 46 and 47 are eliminated, in which emitters of the transistor groups 58 and 59 are connected to the sides of the capacitors 51 and 52, and in which the terminal $t_3$ is directly connected to the emitters of the transistors groups 58 and 59. This modification can be similarly applied to the following examples. However, since the modification is functionally the same as the original example, the following description will mainly relate to examples similar to the example shown in FIG. 1A.

Next, the operations of the example shown in FIG. 1A will be described. It is now assumed that the rightmost one of the contacts 11 of the push-button switches 10 is turned-ON. A positive voltage of the connection terminal $t_1$ is applied to the bases of the transistors 54 and 55 through the diode 28 and the resistors 35 and 36, respectively, to turn-ON these transistors 54 and 55. In response to the turn-ON of the transistor 54, the power source voltage is supplied to the oscillator formed by the transistor 57 and so on. On the other hand, the transistor 56 which is held in its ON-state by a current supplied through the resistor 37 is turned-OFF by the turn-ON of the transistor 55, thereby cutting off a DC current supplied to the transmitter T through the connection terminal $t_1$. Further, the voltage supplied from the contact 11 is applied through the diode 21, the resistor 33 and the diode 48 to the lowermost one of the transistor group 59 to turn it on. At the same time, the voltage supplied from the contact 11 is applied through the resistor 34 and the diode 49 to the uppermost one of the transistor group 58 to turn it on.

Figure 3:
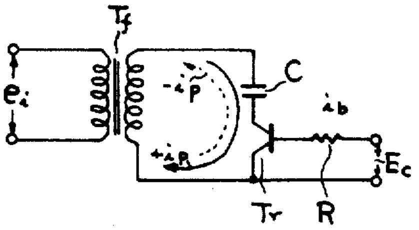
FIG. 3 is a circuit diagram explanatory of the operations of a switching circuit employed in this invention.
Figure 4:
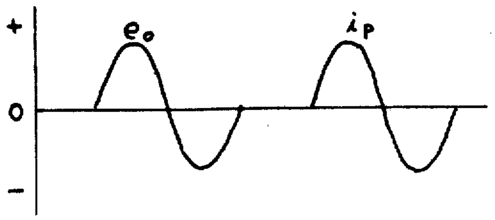
FIG. 4 is a waveform diagram explanatory of the operations of the circuit shown in FIG. 3.

With reference to FIGS. 3 and 4, a description will be given in connection with the turn-ON operation of the transistor groups 58 and 59 under such condition.

In FIG. 3, a reference character Tf indicates a transformer; C designates a capacitor; R identifies a resistor; Tr represents a transistor; $e_i$ denotes an input AC signal voltage; $i_p$ and $-i_p$ show AC signal currents flowing in an LC resonance circuit in response to the input AC signal voltage $e_i$; and $i_b$ represents a base current flowing through the base-emitter path of the transistor Tr in response to the control voltage Ec.

The operations of the circuit shown in FIG. 3 will be described with reference to the waveforms of FIG. 4, which shows the relationship between the input AC signal voltage $e_i$ and the AC signal current $i_p$ flowing through the secondary winding of the transformer Tf, the capacitor C and the transistor Tr when the base current $i_b$ of the transistor Tr is varied. If the base current $i_b$ is established at a value more than the peak value of the AC signal current $i_p$, it is possible to flow the AC signal current $i_p$ in proportion to the input AC signal voltage $e_i$ as shown in FIG. 4. In this case, the circuit loop for flowing therethrough the AC signal current $i_p$ forms a closed loop.

In a case where the AC signal current $i_p$ flows in the direction $+i_p$, the transistor Tr performs its normal operation and the relation that $i_p = h_{fe} \cdot i_b$ is established. In this case, the relation that $i_b \geqq i_p$ is satisfied and the current amplification factor $h_{fe}$ usually has a value of several tens, so that the transistor Tr becomes conductive.

On the other hand, if the AC signal current flows in the direction $-i_p$, the base current $i_b$ is shunted in proportion to the increase in the AC input signal voltage $e_i$ according to the diode characteristic provided at the base-collector path of the transistor Tr, whose base and collector correspond to an anode and a cathode respectively. The increase in the collector voltage in the negative direction results in making the base potential negative and, apparently, the current $-i_p$ flows through the transistor Tr. Namely, the transistor Tr is turned-ON. Furthermore, if the base current $i_b$ flowing through the base-emitter path is zero, the transistor Tr is in the OFF-state as known.

Thus, the transistor groups 58 and 59 are turned-ON in response to their base currents applied through the push-button switches 10, the diode matrix 20 and so on as shown in FIG. 1A. Moreover, a closed loop is formed so that the LC resonance circuit formed by the coil 40 and the capacitor 51 and the LC resonance circuit formed by the coil 43 and the capacitor 52 can be resonant with respective, predetermined frequencies.

The above has been described for the case of turning-ON the rightmost one of the contacts 11 of the push-button switches 10. In the case of turning-ON any other contact, the current supplied to the transmitter T is switched to the oscillator by the switching actions of the transistors 54 and 55 and, on the other hand, the transistor groups 58 and 59 are turned-ON to determine oscillation frequencies corresponding to the selected one of the contacts 11. Thus, the oscillator starts to provide a required combination of two tone signals of different frequencies.

Upon turning-OFF of the contact 11, the supply of the base current to the transistors 54, 55, 58 and 59 is cut off to turn them off, and the oscillation is stopped by the operation reverse to that described above so that a current is supplied to the transmitter T to allow the talking operation.

Other examples of this invention will be described below, in which the number of diodes 48 and 49 are reduced while the rise time of the oscillation output of the oscillator is made shorter in the example shown in FIG. 1A.

Figure 5:
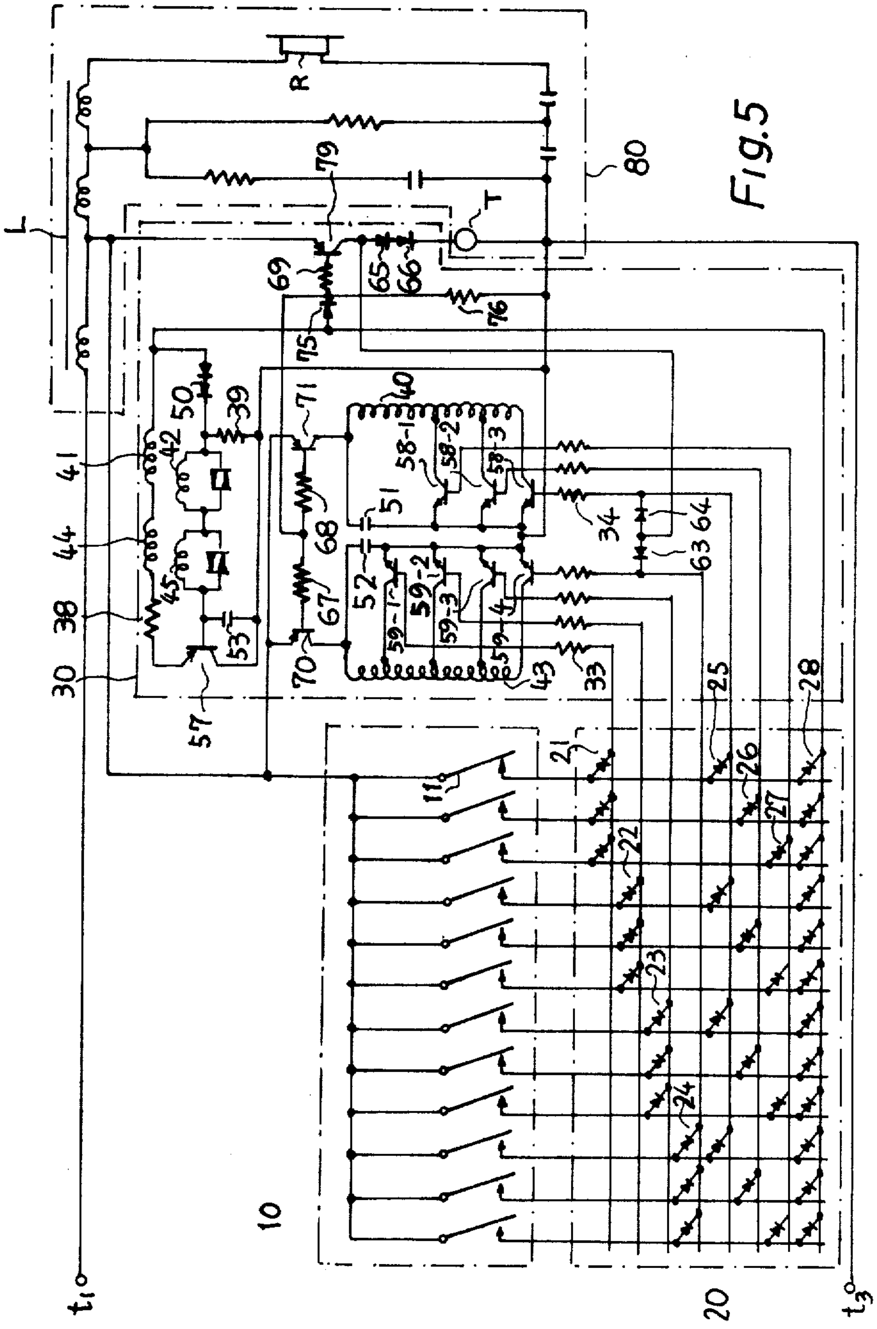
FIGS. 5, 6 and 7 are circuit diagrams each illustrating another example of this invention.

In an example shown in FIG. 5, the resistor groups 31 and 32, diode groups 48 and 49, and a circuit including the transistors 54, 55 and 56 are eliminated, but other circuit elements are further provided as follows:

a. First diodes 63 and 64 are respectively connected, at cathodes, to bases of at least one of the switching transistor groups 58 and 59 coupled to the two coils 40 and 43 respectively.

b. At least one second diode (65, 66) is connected in series to the transmitter T.

c. The anodes of the first diodes 63 and 64 are connected to the one terminal of the series connection of the second diodes 65 and 66 other than the other terminal thereof, which is connected to the transmitter T.

d. Transistors 70 and 71 are provided as switching elements, which are employed for supplying DC currents, through the switching transistors 58 and 59 turned-ON by the first diodes 63 and 64 that are conductive at the noncontact state of the contacts 11, to the respective coils 40 and 43 of the two LC resonance circuits.

e. A transistor 79 is provided to perform ON-OFF control of the DC supply to the transmitter T.

Next, the operation of the example shown in FIG. 5 will be described. It is now assumed that the rightmost one of the contacts 11 of the push-button switch 10 is turned-ON. A positive voltage of the terminal $t_1$ is supplied to the oscillator through the diode 28. As a result of this, the base-emitter path of the transistor 79 turned-ON in response to the DC supply through the resistor 76 and 69 is shunted by the diode 28 and 75. Therefore, the voltage across the base-emitter path is lowered to turn-OFF the transistor 79, so that the DC current supply to the transmitter T is cut off. Further, the voltage from the contact 11 flows through the diode 21 and the resistor 33 to the transistor 59-1 to turn it on, while the voltage from the contact 11 flows also through the diode 25 and the resistor 34 to the transistor 58-3 to turn it on.

Upon turning-OFF the contact 11, the supply of the base currents to the transistors 59-1 and 58-3 and of the current to the oscillator through the diode 28 is cut off to turn them OFF, so that the oscillation is stopped in accordance with operations reverse to those described above, and so that a current is supplied to the transmitter T to permit the talking operation.

Next, a description will be made with regard to operations for speeding up the rise time of the output of the oscillator at the time of depressing one of the push-button switches 10. It is well-known that energy is stored in an LC resonance circuit by flowing a DC current in the coil L thereof so that, when the oscillation is started, the LC resonance circuit is excited by the stored energy, thereby to speed up the starting of the oscillation. This invention provides concrete means for speeding up the starting of the oscillation of the push-button dial device based on the principle mentioned above. Namely, circuits including the diodes 63, 64, 65 and 66, the resistors 67 and 68, and the transistors 70 and 71 in FIG. 5 are the main parts of this example of this invention.

Next, the operations of the example shown in FIG. 5 will be described. In the illustrated condition in which the push-button switches 10 are not despressed, a current is supplied to the base of the transistor 79 through the resistors 76 and 69 to turn-ON the transistor 79. Consequently, the current supplied from the terminal $t_1$ flows through the transistor 79, the diodes 63 and 64 and the resistors 33 and 34 to the bases of the transistors 59-4 and 58-3 to turn-ON these transistors 59-4 and 58-3. On the other hand, the current is supplied to the bases of the transistors 70 and 71 through the resistors 76 and 67 and the resistors 76 and 68 respectively to turn-ON the transistors 70 and 71. Accordingly, when the push-button switches 10 are not depressed, the DC current caused by the DC voltage applied across the terminals $t_1$ and $t_3$ flows through a route: the terminal $t_1$ — the coil L — the transistor 70 — the coil 43 — the transistor 59-4 — the terminal $t_3$, and through a route: the terminal $t_1$ — the coil L — the transistor 71 — the coil 40 — the transistor 58-3 — the terminal $t_3$. Namely, the DC currents flow through the coils 43 and 40 respectively, so that energy is stored therein.

If one of the push-button switches 10 is despressed under such condition, the contact 11 is closed and the current from the resistor 76 flows through the diode 28, so that the voltages across the respective base-emitter paths of the transistors 79, 70 and 71 are reduced to values lower than their conduction voltages to turn them OFF. Therefore, the currents flowing in the coils 43 and 40 are cut off. Furthermore, as described above, if the contact 11 is closed, one of the transistors 59-1, 59-2 and 59-3 and one of the transistors 58-1 and 58-2 are turned-ON to put the oscillator in oscillating desired two frequencies. As mentioned above, the rise time of the oscillation of the oscillator becomes shorter.

Figure 6:
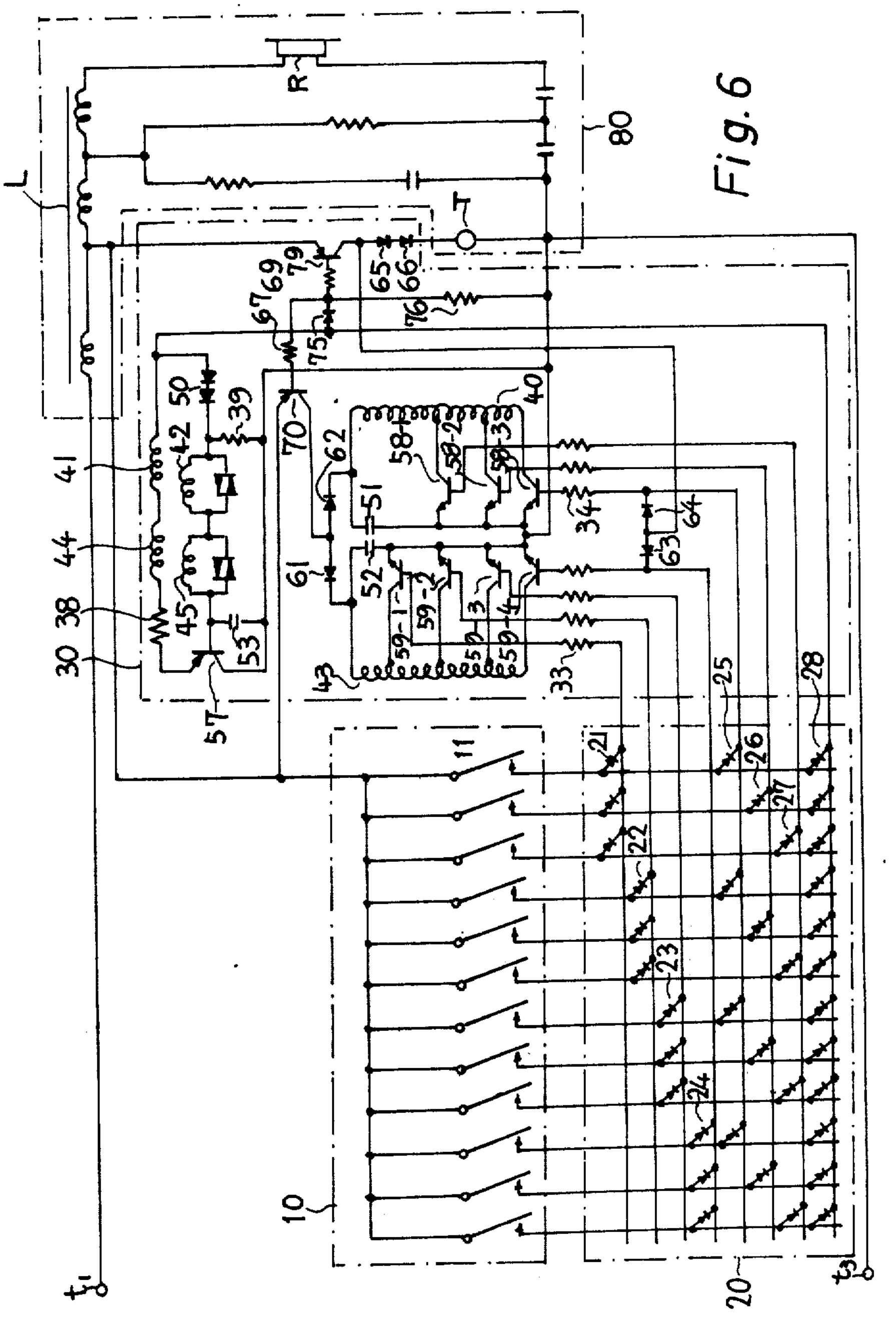

FIG. 6 is another example of this invention, in which the collector of the transistor 70 is connected to the coils 43 and 40 through the diodes 61 and 62, respectively. This example is identical in operations with the example shown in FIG. 5 but has an advantages that the transistor 71 can be eliminated. The diodes 61 and 62 are employed for preventing the AC coupling between the coils 43 and 40.

Figure 7:
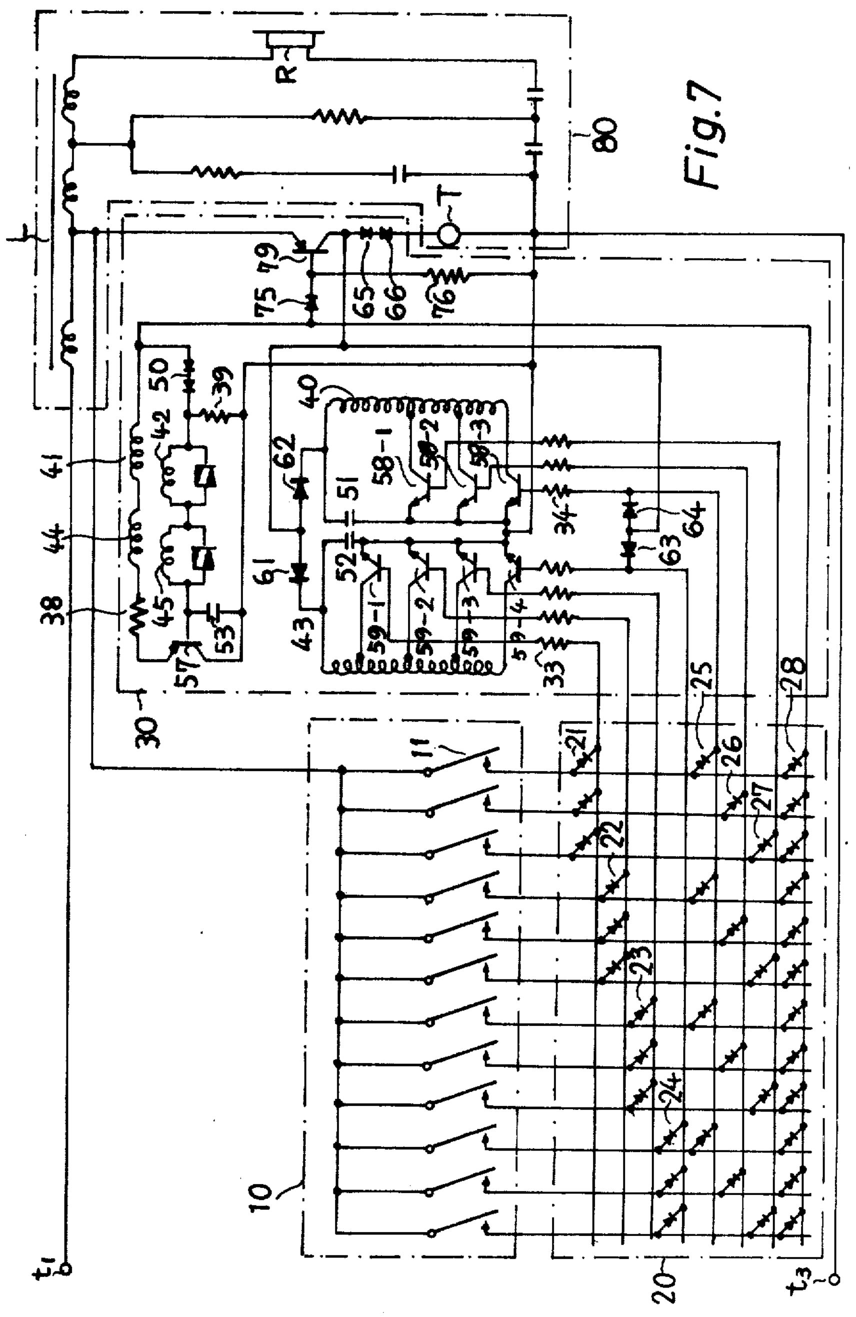

FIG. 7 shows still another example of this invention, in which the diodes 61 and 62 in FIG. 6 are connected to the collector of the transistor 79. This example is advantageous in that the transistor 70 in FIG. 6 can be eliminated. In FIG. 7, the diodes 61 and 62 are mutually connected at the anodes thereof while the diodes 63 and 64 are mutually connected at the anodes thereof, and at the same time the anode of the diode 65 is connected to the commonly connected anodes of the diodes 61, 62, 63 and 64 to make open the upper ends of the coils 43 and 40 in terms of an alternating current at the ON-state of the transistor 79. Accordingly, wiring of the diodes 61 and 62 do not cause any bad influence on the performance of the oscillator.

Although the foregoing examples have been described in connection with the case where the diode matrix 20 is employed, it is also possible to form a switching matrix with mechanical switches, stress-electro transducers or the like in place of the diodes and substitute it for the diode matrix 20. Further, the transistors 79, 70 and 71 may also be replaced by other switching elements.

As described in detail above, the gang-mechanism of the push-button switches, which is an important cause of troubles in the prior art, is effectively removed in accordance with this invention, and only by make-contacting one of the contacts of the push-button switches, the oscillation of two tone signals of two different frequencies can be achieved to transmit a tone dial signal. These remarkably enhance the reliability of the oscillator, decrease the force for depressing the push button and reduce the size of the overall construction. Furthermore, the contacts of the switches are inserted in the AC signal loop of the oscillator in the conventional push-button dial device, so that the leading-out of a signal from the contacts for other purpose, such as for lighting an indicator, greatly deteriorates the performance of the oscillator. In the present invention, however, no AC coupling excists between the contacts of the push-button switches and the oscillator, so that even if a signal is led out from the contacts for any other purposes, no influence is exerted on the oscillator. Moreover, since DC currents are supplied to the coils of the CL resonance circuits through the diodes and the switching elements, the rise time of the oscillation can be effectively shortened. With such merits as described above, this invention can be also applied to various other devices, such as a data input device in which its contents are displayed by indicator tubes by depressing push-button switches and, at the same time, transmitted in the form of a tone signal.

What I claim is:

1. A two-tone generator for producing a dial tone in the form of two-tone signal, comprising:

a two-tone oscillator having two LC resonance circuits each composed of a primary coil and a secondary coil and a capacitor in parallel with said secondary coil;

a plurality of switching transistors having the collector-emitter paths thereof coupled between corresponding taps along respective ones of said secondary coils and said capacitors to switch the values of the inductances of the secondary coils in response to turning-ON of ones of said switching transistors;

a plurality of switches individually controllable and each having a contact operable to an open and a closed condition;

a matrix connected to the contacts of the switches for providing outputs corresponding to closed contacts of the switches; and biasing means electrically coupled to said matrix and said switching transistors for biasing the bases of respective selected ones of said switching transistors of the two LC resonance circuits with base currents sufficient to turn-ON said selected ones of said switching transistors in response to said outputs of the matrix.

2. A two-tone generator according to claim 1, further including:

first diodes each having a cathode connected to the base of a respective one of the switching transistors of the two LC resonance circuits, at least one second diode connected in series through a transmitter with said biasing means, said first diodes being connected to the terminal of the second diode opposite to the diode terminal connected to the transmitter, and switching elements connected between said resonance circuits and said biasing means and biased to conduct when none of the switch contacts are closed for supplying DC currents to the respective secondary coils of the two LC resonance circuits through said switching transistors.

3. A two-tone generator according to claim 2, further comprising a transistor connected through the second diode with the biasing means for controlling the supply of a DC current to the transmitter.

* * * * *